(12) United States Patent
Hiramoto

(10) Patent No.: US 7,612,347 B2
(45) Date of Patent: Nov. 3, 2009

(54) CHARGED PARTICLE BEAM APPARATUS AND CHARGED PARTICLE BEAM RESOLUTION MEASUREMENT METHOD

(75) Inventor: Makoto Hiramoto, Tokyo (JP)

(73) Assignee: NuFlare Technology, Inc., Numazu-shi (JP)

( * ) Notice: Subject to any disclaimer, the term of this patent is extended or adjusted under 35 U.S.C. 154(b) by 350 days.

(21) Appl. No.: 11/774,823

(22) Filed: Jul. 9, 2007

(65) Prior Publication Data

US 2008/0011963 A1    Jan. 17, 2008

(30) Foreign Application Priority Data

Jul. 11, 2006    (JP)    .............................. 2006-190128

(51) Int. Cl.
*H01J 37/244*    (2006.01)
*G01T 1/29*    (2006.01)
(52) U.S. Cl. .................................... 250/397; 250/491.1
(58) Field of Classification Search .............. 250/491.1, 250/397

See application file for complete search history.

(56) References Cited

U.S. PATENT DOCUMENTS 4,336,597 A * 6/1982 Okubo et al. ............... 250/397
4,675,528 A * 6/1987 Langner et al. ......... 250/396 R

FOREIGN PATENT DOCUMENTS

JP            4-242919        8/1992
JP      2007188671 A  *  7/2007

* cited by examiner

*Primary Examiner*—Jack I Berman
(74) *Attorney, Agent, or Firm*—Oblon, Spivak, McClelland, Maier & Neustadt, L.L.P.

(57) ABSTRACT

A charged particle beam apparatus in accordance with one preferred form of this invention includes an irradiation unit for irradiating a charged particle beam, an instrumentation unit which performs instrumentation of a reflection signal from a mark as obtained by scanning the mark while irradiating the charged particle beam onto the mark, and a measurement unit which uses an approximation equation defined by use of a prespecified mark shape function and an error function to perform the fitting of a waveform obtained based on the reflection signal and which measures beam resolution which becomes a parameter of the error function from the waveform obtained based on the reflection signal.

13 Claims, 11 Drawing Sheets

CHARGED PARTICLE BEAM APPARATUS AND CHARGED PARTICLE BEAM RESOLUTION MEASUREMENT METHOD

CROSS-REFERENCE TO RELATED APPLICATION

This application is based upon and claims the benefit of priority from Japanese Patent Application No. 2006-190128, filed on Jul. 11, 2006, the entire contents of which are incorporated herein by reference.

BACKGROUND OF THE INVENTION

1. Field of the Invention

The present invention relates to a charged particle beam apparatus and a charged particle beam resolution measuring method. More particularly but not exclusively, this invention relates to an electron beam resolution measurement method adaptable for use in a charged particle beam apparatus for irradiating an electron beam onto a workpiece while variably shaping the electron beam. This invention also relates to an apparatus for implementation of such method.

2. Related Art

Lithography technology with contribution to semiconductor device miniaturization is a very important process among semiconductor manufacturing processes because it offers a unique feature of pattern generation capability. In recent years, with an increase in integration density of LSI chips, circuit line widths required for semiconductor devices are becoming more smaller year by year. To form a desired circuit pattern on these semiconductor devices, a need is felt to use a high-accuracy original pattern (also known as a reticle or a mask). Note here that electron ray (electron beam) pattern writing techniques are inherently superior in image resolution and, for this reason, are widely employed in the manufacture of such high-accuracy original pattern.

FIG. 11 is a conceptual diagram for explanation of an operation of one prior known variable-shaped electron beam (EB) pattern writing apparatus.

The variable-shaped EB writing apparatus operates in a way which follows. A first aperture 410 has a rectangular opening or hole 411, which formed therein for shaping an electron beam 330. A second aperture 420 has therein a variable shaping rectangular hole 421 for reshaping the electron beam 330 that passed through the hole 411 into a desired rectangular shape. The electron beam 330, which was emitted from a charged particle source 430 and has passed through the hole 411, is deflected by a deflector. Then, it passes through part of the variable shaping hole 421 and is then irradiated onto a workpiece 340, which is mounted on a stage. This stage is driven to move continuously in a specified one direction (e.g., X direction) during pattern writing. More specifically, a rectangular beam shape capable of penetrating both the hole 411 and the variable shaping hole 421 is shot to a pattern write area of the workpiece 340 which is placed on the stage that moves continuously. This technique for forming desired shapes while letting the beam penetrate both the hole 411 and variable shaping hole 421 is called the variable shaping scheme.

The accuracy and minimum image resolution size of a pattern that was formed using the above-stated EB lithographic apparatus are in close relationship with the resolving power of a beam used. On the other hand, in the case of a pattern being written on a substrate, there must exist several factors for materially degrading the resolution (i.e., process resolution), which factors are caused by the contrast of a resist film coated on the substrate and/or some processes, such as oxidation diffusion of a resist of the chemical amplification type. In currently available EB lithographic tools, the beam resolution of an EB tool per se has been improved (lessened), whereby it has been made equal to or smaller in value than the process resolution in a computational sense.

Here, a beam intensity distribution of the electron beam 330 to be irradiated onto the workpiece 340 is such that the electron beam 330 is scanned in such a way that the electron beam 330 is irradiated on a metallic mark having its size which is sufficiently less than the beam size of electron ray 330. And, a technique for performing instrumentation of reflected electrons from the metal mark is known (for example, see JP-A-4-242919). And, from the beam intensity distribution of the electron ray 330 thus obtained, it is possible to obtain the beam resolution of electron ray 300.

However, the beam intensity distribution obtained in this way is largely deviated from the waveform of an error function.

FIG. 12 is a diagram showing one example of the beam intensity distribution.

In FIG. 12, the beam intensity distribution indicates a result of measurement for instrumentation of reflected electrons from the metal mark by the scanning of an electron beam on the metal mark. Here, the beam intensity distribution is ideally defined by an error function $F(x)$. However, the beam intensity distribution obtained (measured value) has been appreciably deviated from the waveform of such error function. One reason of this is that a distribution due to scattering from the metal mark used for the measurement is combined or "synthesized" together. Another reason considered is that the shape of such metal mark affects it. Accordingly, there is a problem as to unwanted increases in value of a beam resolution obtained when compared with the inherent beam resolution. This would result in peak out of the measurement result, which in turn leads to occurrence of a limit in measurable range also. Thus, it has been unable to measure small resolution.

BRIEF SUMMARY OF THE INVENTION

It is therefore an object of the present invention to provide a method for measuring the resolution of a beam with increased accuracy and a pattern writing apparatus which implements the method.

In accordance with one aspect of this invention, a charged particle beam apparatus includes an irradiation unit which irradiates a charged particle beam, an instrumentation unit which performs instrumentation of a reflection signal from a mark that is obtained by scanning the mark while irradiating the charged particle beam onto the mark, and a measurement unit which uses an approximation equation defined by use of a prespecified mark shape function and an error function to perform the fitting of a waveform obtained based on the reflection signal and which measures the beam resolution for use as a parameter of the error function from the waveform obtained based on the reflection signal.

In accordance with another aspect of the invention, a charged particle beam apparatus includes an irradiation unit operative to irradiate a charged particle beam, an instrumentation unit which performs instrumentation of a transmission signal of particles that exhibits penetration without hitting a mark, which signal is obtained by performing scanning by the charged particle beam from a near side of the mark until the beam passes through the mark, and a measurement unit which uses an approximation equation defined by use of a prespecified mark shape function and an error function to perform fitting of a waveform obtained based on the reflection signal and which measures the beam resolution for use as a parameter of the error function from the waveform obtained based on the reflection signal.

In accordance with a further aspect of the invention, a method for measuring the resolution of a charged particle beam, which method includes the steps of scanning on a mark while irradiating the mark with a charged particle beam, measuring a reflection signal from the mark due to irradiation of the charged particle beam, and using an approximation equation defined by use of a prespecified mark shape function and an error function to perform fitting of a waveform obtained based on the reflection signal and then measure the beam resolution which becomes a parameter of the error function from the waveform obtained based on the reflection signal.

DETAILED DESCRIPTION OF THE INVENTION

In embodiments disclosed herein, a configuration using an electron beam will be described as one example of the charged particle beam. Note here that the charged particle beam should not exclusively be limited to only the electron beam and may alternatively be other similar suitable beams using charged particles, such as an ion beam.

Also note that in some cases, the beam resolution is approximated by a beam intensity distribution error function so that its parameter $\sigma$ is used to define the resolution although it is dependent on the definition. Alternatively, in other cases, the resolution is defined by either a width (length) value of from a position at which it becomes ten percent (10%) of the maximum beam intensity to a position whereat it becomes 90% or a width (length) of from a position at which it becomes 20% of the maximum beam intensity to a position whereat it becomes 80% In the embodiments set forth below, approximation is done by the beam intensity distribution error function for using its parameter $\sigma$ to define the beam resolution.

And, it has been found by the inventor that the waveform indicated by a reflection signal obtained is practically dependent upon the shape of a mark used. Consequently, the reflection signal is subjected to fitting by use of an approximation equation which is defined using a prespecified mark shape function and its associated error function. Whereby, it becomes possible to further improve the fitting accuracy, as will be described later. By improving the fitting accuracy using the mark shape-based functions in this way, it is possible to obtain the value $\sigma$ of the beam resolution within the error function with the mark shape dependency being removed away. An explanation will be given using the accompanying drawings below.

EMBODIMENT 1

Figure 1:
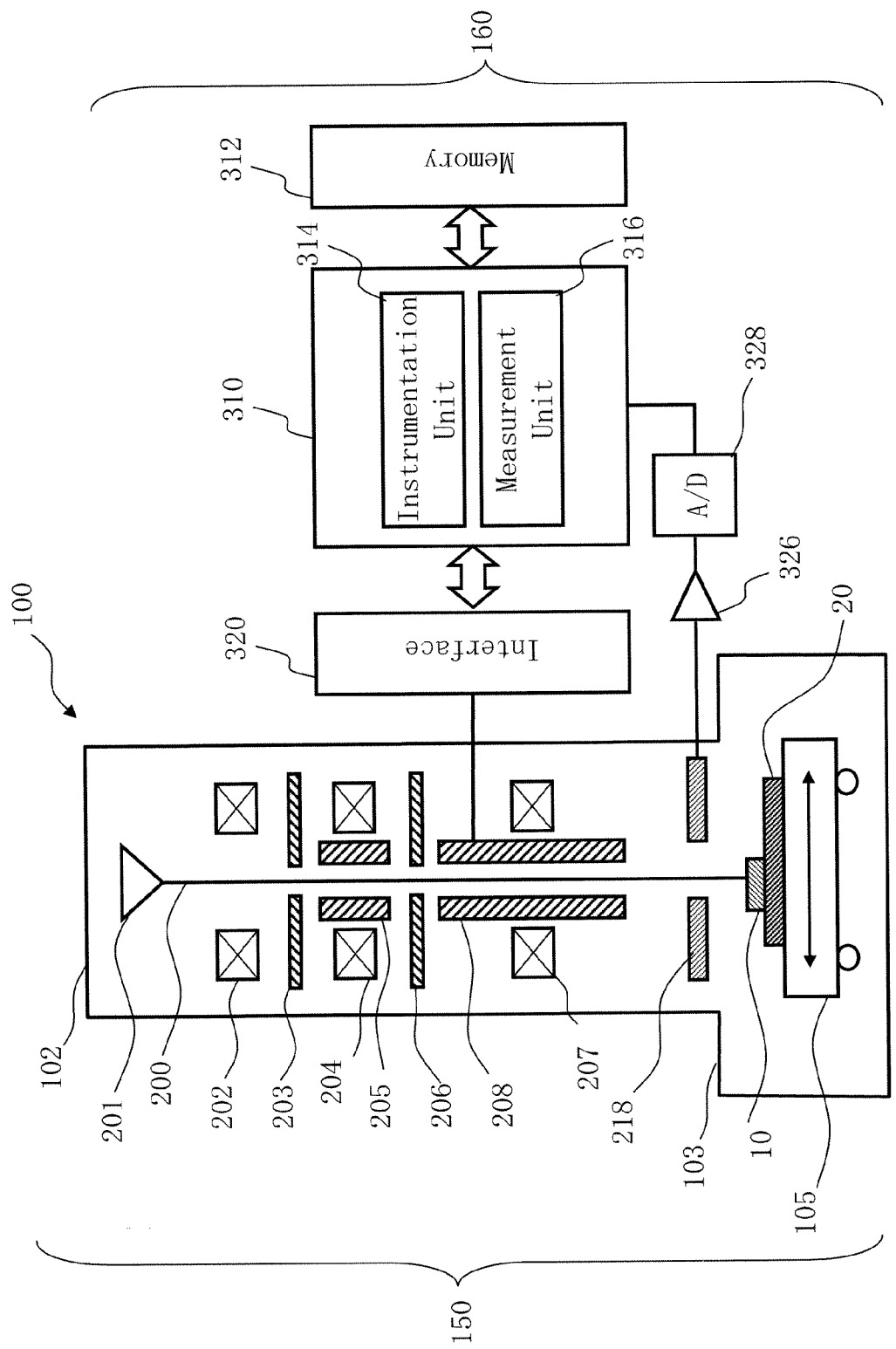
FIG. 1 is a conceptual diagram showing a configuration of a pattern writing apparatus embodying the invention.

FIG. 1 is a conceptual diagram showing a configuration of a pattern writing apparatus 100 in accordance with one embodiment of this invention.

In FIG. 1, the lithographic apparatus 100 is one example of a charged-particle beam pattern writing apparatus as claimed. This lithography tool 100 is for writing or "drawing" a pattern on a workpiece 101. The workpiece 101 includes a photomask for use in the manufacture of semiconductor devices. The lithography tool 100 has a pattern writing unit 150 and a control unit 160. The pattern writing unit 150 includes an electron lens barrel 102, an XY stage 105, an electron gun 201 (i.e., irradiation unit), an illumination lens 202, first aperture 203, projection lens 204, deflector 205, second aperture 206, objective lens 207, deflector 208, and detector 218 (measurement unit). The control unit 160 includes a control computer with central processor unit (CPU) 310, interface circuit 320, memory 312, amplifier 326, and analog-to-digital converter (ADC) 328.

In the electron lens barrel 102, there are disposed the electron gun 201, illumination lens 202, first aperture 203, projection lens 204, deflector 205, second aperture 206, objective lens 207, deflector 208 and detector 218. The interface circuit 320, memory 312 and ADC 328 are connected to CPU 310. The interface circuit 320 is connected to the deflector 208. The ADC 328 is connected to the amplifier 326, which is coupled to the detector 218. In FIG. 1, those constituent parts necessary for description of the embodiment 1, are shown. The lithography tool 100 may be designed to include therein other parts or components. Additionally, although in FIG. 1 the CPU 310 that becomes one example of a computer is arranged to execute respective functions of an instrumentation unit 314 and a measurement unit 316 or else, this is not to be construed as limiting the invention and it may be implemented by combination of electrical circuit-based hardware and software.

Alternatively it may be designed to employ a combination of hardware and firmware. Still alternatively, it may be arranged by hardware using electrical circuitry in place of the CPU 310.

An electron beam 200 which is emitted from the electron gun 201 is guided by the illumination lens 202 to illuminate an entirety of the first aperture 203 which has its rectangular opening or hole. At here, the electron beam 200 is shaped to have a rectangular shape in cross-section. Then, the electron beam 200 of the first aperture's image which passed through the first aperture 203 is projected onto the second aperture 206 with the aid of the projection lens 204. A position of the first aperture image on this second aperture 206 is controlled by the deflector 205 to thereby enable the beam to vary in shape and size. The electron beam 200 of second aperture image which passed through the second aperture 206 is subjected to focusing adjustment by the objective lens 207 and is deflected by the deflector 208 and then irradiated onto a silicon (Si) substrate 20 that is mounted on the movably disposed XY stage 105 in such a way as to scan a dot mark 10 on the Si substrate 20, which becomes a metal mark. The deflector 208 is controlled by the control computer 310 via the interface circuit 320. Input/output (IO) data, such as a result of computation by the control computer 310, are stored in the memory 312.

Using the lithographic tool 100, an intensity distribution and resolving power of an electron beam being irradiated by this tool 100 are measured. A technique for measuring the beam intensity distribution and the beam resolution will be explained below. Note that respective operations and computing processing tasks at respective process steps to be set forth below are controlled by the control computer 310.

Figure 2:
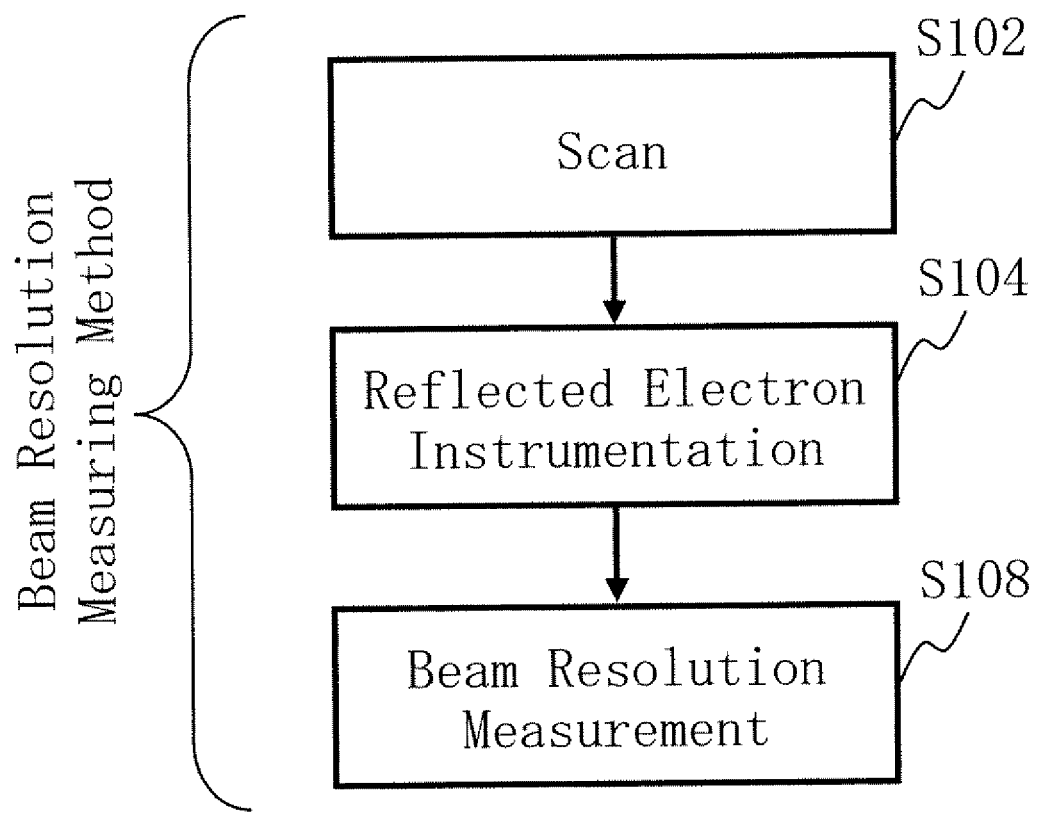
FIG. 2 is a flow chart showing one example of main process of an electron beam resolution measurement method for use in the embodiment apparatus.

FIG. 2 is a flow chart showing one example of a series of major steps of a beam resolution measurement method for use in the embodiment apparatus shown in FIG. 1.

In FIG. 2, an electron beam intensity distribution method is arranged to perform a series of steps including a scanning step S102, a reflected electron instrumentation step S104, and a beam resolution measurement step S108.

Firstly, a workpiece, e.g., Si substrate 20 having its surface on which a dot mark 10 is formed, is disposed on the XY stage 105. This XY stage 105 is previously adjusted in position so that the electron beam 200 irradiates the Si substrate 20. This Si substrate 20 may be externally transported and loaded onto the XY stage 105 or may alternatively be fixedly situated in advance on the XY stage 105. In the case of prefixation on XY stage 105, it is preferable that the substrate be fixed and disposed at a position which does not disturb the layout of mask blanks or the like to be inherently applied pattern writing.

At the scanning step S102, the dot mark 10 with a rectangular planar shape, which is one example of a dot pattern formed on the Si substrate 20, is used to scan the electron beam 200 having a beam size less than the width size of the dot mark 10 while simultaneously irradiating the electron beam 200 so that a beam spot moves from near side of the dot mark 10 onto this dot mark 10.

Figure 3:
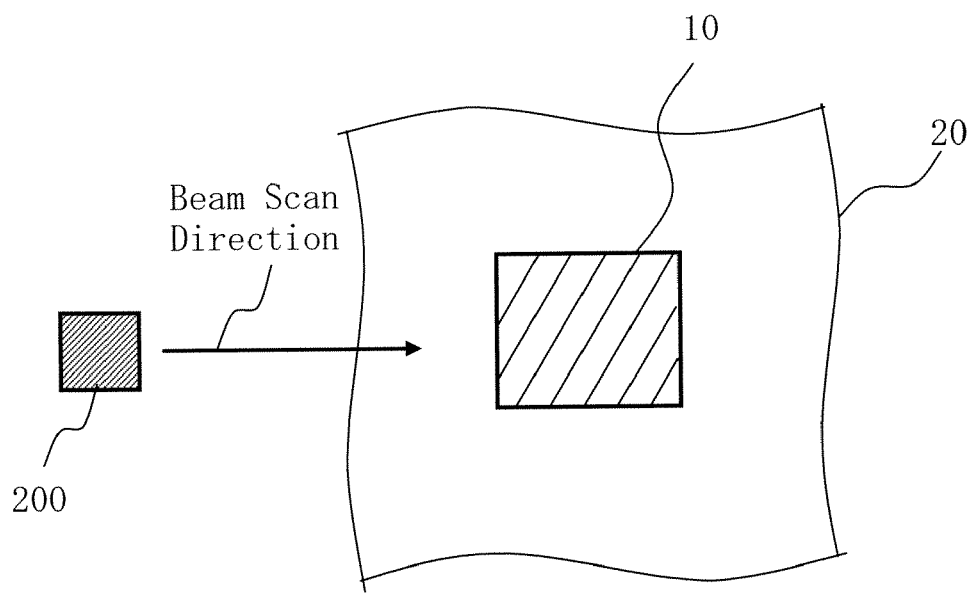
FIG. 3 is a conceptual diagram for explanation of the way of scanning of an electron beam in the illustrative embodiment.

FIG. 3 is a conceptual diagram for explanation of the way of scanning of an electron beam in the illustrative embodiment.

On the Si substrate 20, the rectangular dot mark 10 which is one example of a metallic mark is formed. And, the electron beam 200 with a shaped spot is scanned toward the dot mark 10 from a direction at right angles to a peripheral edge of the dot mark 10.

The dot mark 10 is made of a chosen material having its reflectivity larger than that of the Si substrate 20. An example of the material is high-melting-point metals, such as tungsten (W), tantalum (Ta) or the like. Another preferable example is a heavy metal, such as gold (Au), platinum (Pt) or else. The dot mark 10 is manufacturable by semiconductor device fabrication processes so that pattern shapes are formable with superior accuracy when compared to knife edges that are usually produced by mechanical processing. As a result, edge linearity and roughness may be improved in comparison with mechanically processed knife edge components. And, as the dot mark 10 is manufacturable by semiconductor fabrication processes, it is possible to produce a large number of ones at low costs when compared to the knife edges. Here, it is preferable that the dot mark 10 is designed to have a sufficiently large size with respect to the shaped spot of electron beam 200.

At the reflected electron instrumentation step S104, reflection electrons that are reflected from the dot mark 10 due to irradiation of the electron beam 200 are measured.

Figure 4:
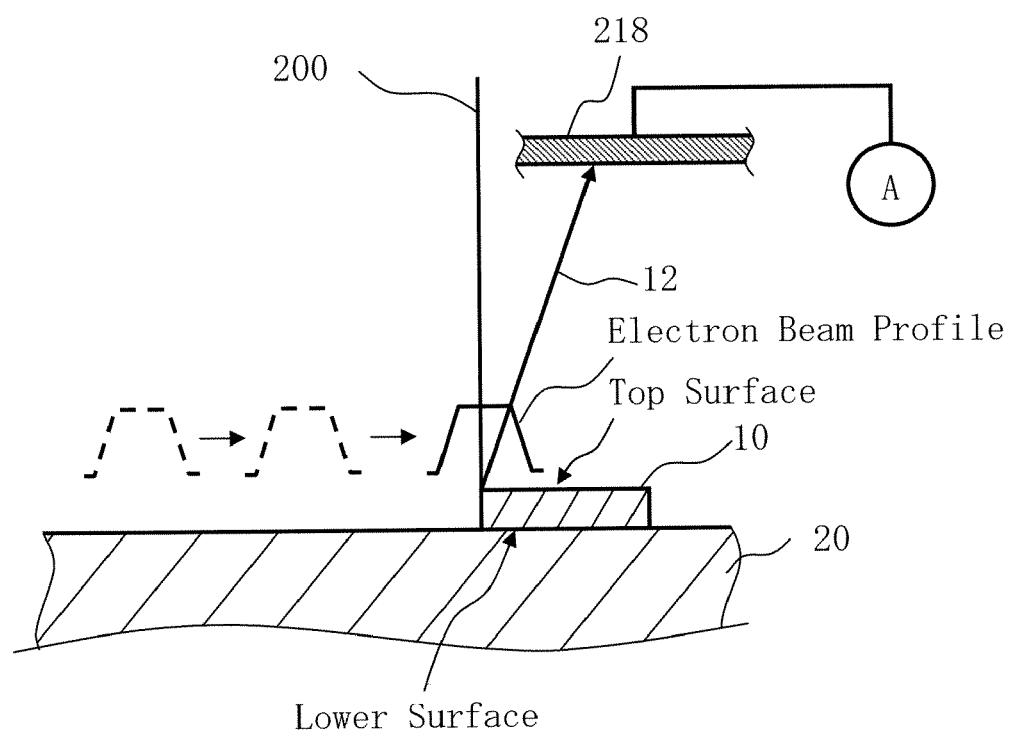
FIG. 4 is a conceptual diagram for explanation of the way of measuring reflected electrons in the embodiment.

FIG. 4 is a conceptual diagram for explanation of the way of performing instrumentation of such reflected electrons in the embodiment 1.

As shown in FIG. 3, the electron beam 200 which is shaped into a rectangular spot by way of example is guided to perform scanning toward the dot mark 10. Then, as shown in FIG. 4, when the electron beam 200 hits the dot mark 10 which is rectangular in cross-section, reflection electrons 12 are given off from the dot mark 10 due to irradiation of electron beam 200. These reflection electrons 12 jumped out are then detected by the detector 218. A reflection signal which is sensed by the detector 218 is amplified by the amplifier 326. Then, the resulting signal is converted by the ADC 328 into corresponding digital information, which is sent to the control computer 310. Then, the instrumentation unit 314 applies differentiation computation to the reflection signal as input thereto, for determining its absolute value. In this way, beam intensity distribution waveform data is obtained through instrumentation.

However, as previously stated, the differentiation waveform thus obtained can experience unwanted occurrence of significant deviation relative to the waveform that is indicated by a beam intensity distribution error function. One reason of this is that the shape of the dot mark 10 is not actually formed accurately to have the intended rectangular shape such as that shown in FIG. 4. Another reason considered is that dispersion of the electron beam 200 due to the dot mark 10 also affects it. Here, it has been found by the inventor that a successful solution is attainable by taking into consideration the shape of the dot mark 10 in order to obtain an adequate approximation equation which is fitted to the waveform obtained.

At the beam resolution measurement step S108, the measurement unit 316 uses a specific approximation equation which is defined by using a mark shape function and beam intensity distribution error function as will be indicated below to perform the fitting of a waveform based on the measured reflection signal, thereby to measure the beam resolution from a waveform based on the reflection signal. As previously stated, in order to obtain the approximation equation that is best fit to the waveform obtained, the solution is attainable by taking account of the shape of the dot mark 10. More specifically, the approximation equation is defined by a function with convolution of the dot mark 10's shape function and beam intensity distribution error function as shown in Equation (1) below, thereby enabling obtainment of an approximation function R(x) which is well matched with the waveform that was obtained through instrumentation.

$$R(x) = \int \left\{ P(x') \cdot \frac{dF(x-x')}{dx} \right\} dx' \qquad (1)$$

Here, let the mark shape function be represented by P(x), and let the beam intensity distribution error function be F(x). Additionally, regarding the beam intensity distribution error function F(x), the beam resolution is given as σ. When the beam width is set to "2W," it is representable by Equation (2) below.

$$F(x) = \frac{1}{2}\left\{\mathrm{erf}\left(\frac{x+w}{\sigma}\right) - \mathrm{erf}\left(\frac{x-w}{\sigma}\right)\right\} \quad (2)$$

Figure 5:
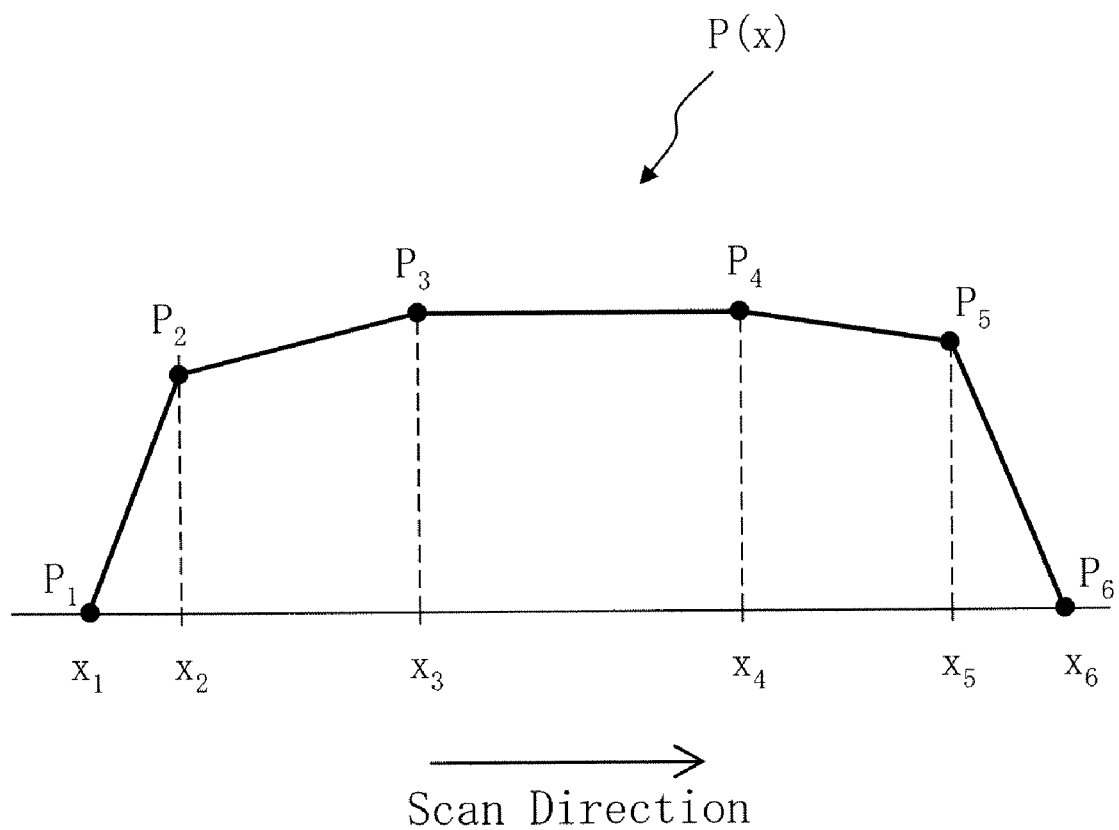
FIG. 5 is a diagram showing one example of a mark shape cross-section in the embodiment.

FIG. 5 is a diagram showing one example of the mark shape cross-section in the embodiment.

Note here that it has been found by the inventor that it is preferable to use as the mark shape to be defined in the mark shape function P(x) a trapezoidal shape having respective side faces at anterior and posterior positions along the scanning direction of the electron beam 200 being slanted or tilted downwardly like a skirt as shown in FIG. 5. More specifically, the shape used is such that a line of one side face connecting together a point P1 and point P2 and a side line segment coupling together a point P5 and point P6 shown in FIG. 5 are each slanted to expand from a top surface toward a bottom face. And, it has also been found that it is preferable to use the mark shape in which a line segment coupling a point P3 and point P2 which becomes a terminate end of the top face is slanted toward the side face. More precisely, the shape used is such that a side face extending from a point P3 to the point P2 shown in FIG. 5 is sloped downwardly toward the side face coupling together the points P1 and P2. Similarly, it has also been found that it is preferable to use the mark shape in which a line segment coupled by a point P4 which becomes a terminate end of the top face and a point P5 is slanted toward the side face. More specifically, the shape used is such that a side line segment extending from the point P4 to point P5 shown in FIG. 5 is sloped downwardly toward the side face that couples together the points P5 and P6. A mark shape function P(x) which represents such the mark shape is shown in Equations (3-1) to (3-5) presented below. Two-point interrelation functions of respective positions $x_1$ to $x_6$, are defined by parameters $a_1$-$a_5$, and $b_1$-$b_5$, respectively, which parameters are subjected to adjustment for matching or "tune-up."

$$P(x)=a_1x+b_1K(x_1\leq x<x_2) \quad (3\text{-}1)$$

$$P(x)=a_2x+b_2K(x_2\leq x<x_3) \quad (3\text{-}2)$$

$$P(x)=a_3x+b_3K(x_3\leq x<x_4) \quad (3\text{-}3)$$

$$P(x)=a_4x+b_4K(x_4\leq x<x_5) \quad (3\text{-}4)$$

$$P(x)=a_5x+b_5K(x_5\leq x<x_6) \quad (3\text{-}5)$$

In this way, the integration function of a product of the mark shape function P(x) with the side face lines being slanted and with the top face being arranged to have its terminate end portions be sloped toward the above-noted side faces and the differentiated beam intensity distribution error function F(x) is used as the approximation function R(x), the result of execution of the Is fitting of the waveform measured by the measurement unit 316 becomes as follows. The fitting computation used here is a least-squares method. Two-point interrelation functions of respective positions $x_1$, to $x_6$, are defined by parameters $a_1$-$a_5$ and $b_1$-$b_5$, in the mark shape function P(x) and defined by parameters σ and w in the beam intensity distribution error function F(x): these parameters are subjected to matching.

Figure 6:
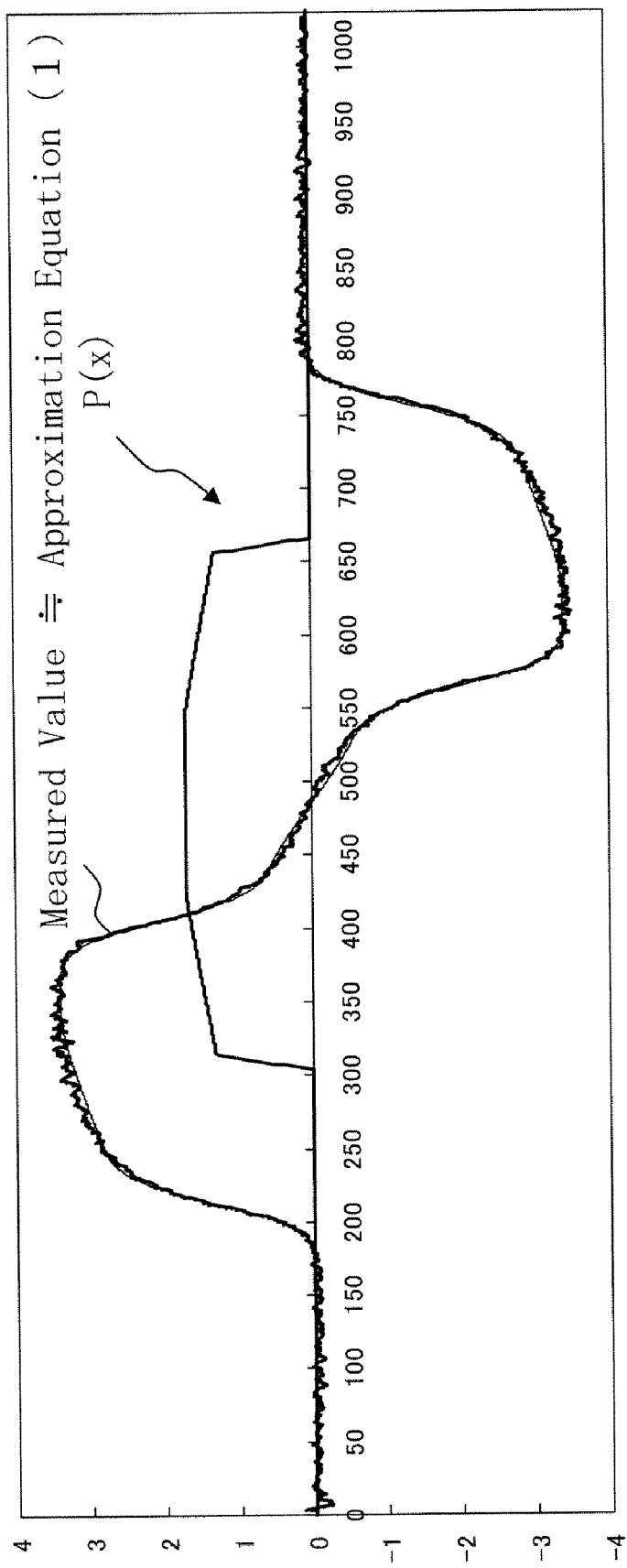
FIG. 6 is a diagram showing one example of a beam intensity distribution waveform and a waveform due to an approximation equation in the embodiment.

FIG. 6 is a diagram showing one example of a beam intensity distribution waveform and a waveform due to the approximation equation in the embodiment. As shown in FIG. 6, as a result of execution of the fitting of the waveform measured by the above-stated approximation function R(x) (approximation equation 1), it was possible to match together the measured value and the approximation equation with increased accuracy. And, the value of beam resolution σ which becomes a parameter of the intensity distribution error function F(x) which is in the state that the fitting was done becomes the inherent beam resolution σ owned by the electron beam 200 in the stand-alone EB lithography tool 100 with its mark shape dependency being excluded. Thus it is possible to measure highly accurate beam resolution σ by performing the fitting by the approximation equation that is defined using such the approximation function R(x) and the intensity distribution error function F(x).

Figure 7:
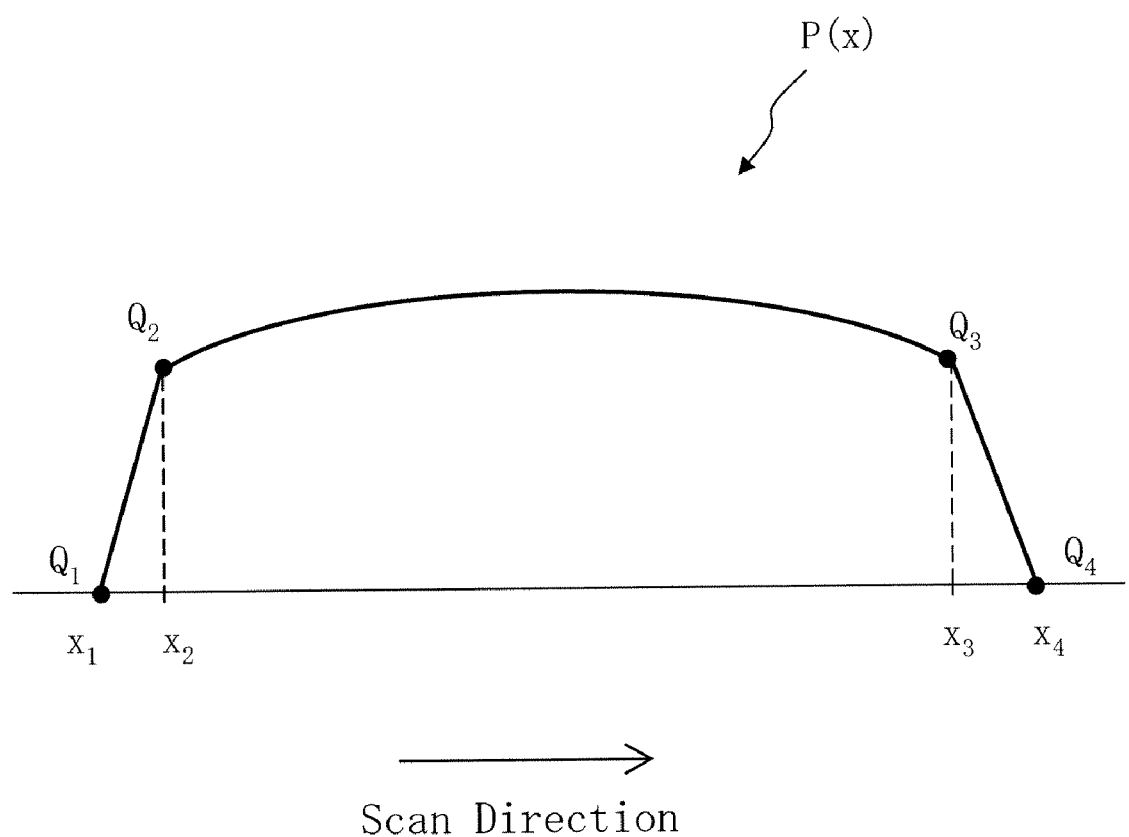
FIG. 7 is a diagram showing another exemplary mark shape cross-section in the embodiment.

FIG. 7 is a diagram showing another example of the mark shape cross-section in the embodiment 1.

It has been found by the inventor that a specific mark shape with its top face being curved as shown in FIG. 7 is preferably used as the mark shape to be defined to the mark shape function P(x). More specifically, the mark shape used is designed so that a line of its top face connected by points Q2 and Q3 is curved. And, it is similar to the above-stated one in that regarding the side face lines thereof, it is preferable to use a mark shape with each of respective side faces at anterior and posterior locations in the scanning direction of the electron beam 200 being slanted and widened downwardly in the manner stated supra. In other words, the shape used is such that the side face line connected by P1 and P2 shown in FIG. 5 and the side face line coupled by P3 and P4 are slanted, like a skirt, to become wider from the top face toward the bottom face. A mark shape function P(x) representing such the mark shape is indicated in Equations (4-1) to (4-3) below.

$$P(x)=a_1x+b_1K(x_1\leq x<x_2) \quad (4\text{-}1)$$

$$P(x)=a_2(x-d)^2+b_1K(x_2\leq x<x_3) \quad (4\text{-}2)$$

$$P(x)=a_3x+b_3K(x_3\leq x<x_4) \quad (4\text{-}3)$$

While using as the approximation equation R(x) the integration function of a product of the mark shape function P(x) with the sideface lines being slanted and with the top face being curved in this way and the differentiated beam intensity distribution error function F(x), the fitting is performed of the waveform measured by the measurement unit 316, a result of which becomes as follows. The fitting computation used is a least-squares method. Two-point interrelation functions of respective positions $x_1$ to $x_4$, are defined by parameters $a_1$-$a_3$, $b_1$-$b_3$ and d in the mark shape function P(x) and defined by parameters σ and w in the intensity distribution error function F(x), and these parameters are subjected to matching.

Figure 8:
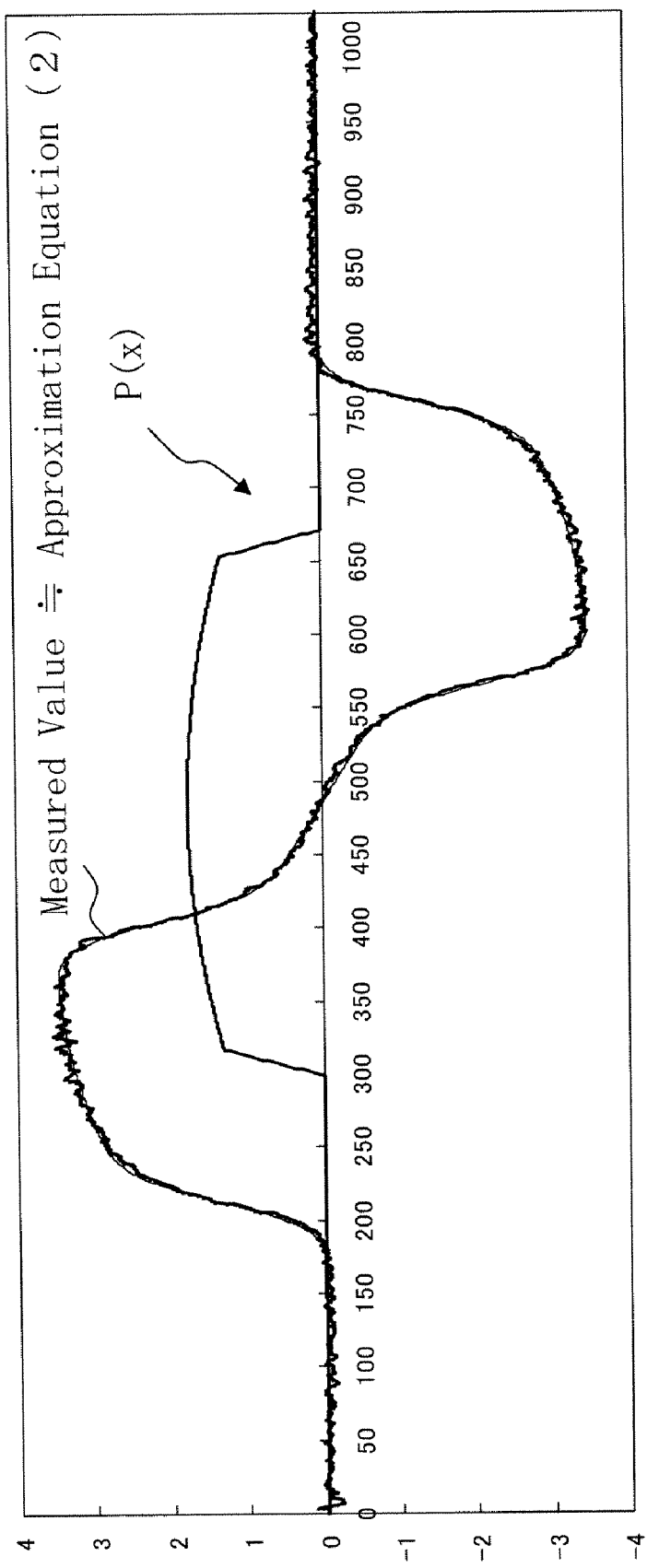
FIG. 8 is a diagram showing one example of a beam strength distribution waveform and a waveform due to approximation equation in the embodiment.

FIG. 8 is a diagram showing one example of a beam strength distribution waveform and a waveform due to the approximation equation in the embodiment 1. As shown in FIG. 8, as a result of executing the fitting of the waveform that is measured by the above-noted approximation function R(x) (approximation equation 2), it was possible to match together the measured value and the approximation equation with enhanced accuracy. Accordingly, the value of beam resolution σ which becomes a parameter of the intensity distribution error function F(x) which is in the state that the fitting was done becomes the beam resolution σ inherent to the electron beam 200 in the stand-alone EB lithography tool 100 with its mark shape dependency excluded. Thus it is possible to measure the high-accuracy beam resolution σ by performing the fitting by the approximation equation that is defined using the approximation function R(x) and the intensity distribution error function F(x).

EMBODIMENT 2

While in the embodiment 1, the electron beam 200 is scanned toward the dot mark 10 and the detector 218 is used to detect reflection electrons 12 which flied out due to collision of the electron beam 200 with the dot mark 10 as shown in FIG. 4, the measurement method should not exclusively be limited thereto. In an embodiment 2, an arrangement may be employed for scanning the electron beam 200 from near side of the dot mark 10 toward the dot mark 10 until it passes through the dot mark 10 while causing the detector to detect those electrons which passed through it while the electron beam 200 does not hit the dot mark 10.

Figure 9:
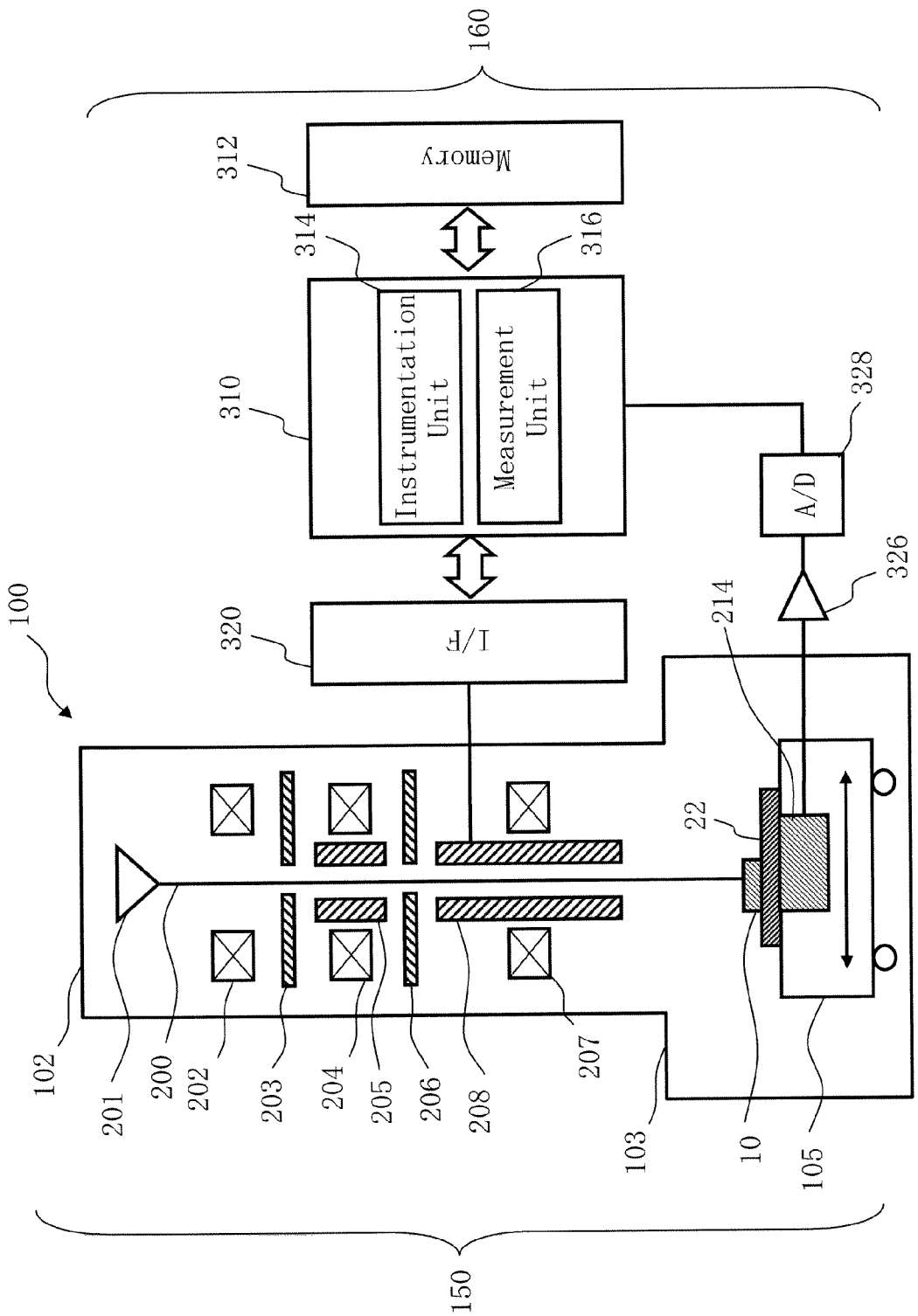
FIG. 9 is a conceptual diagram showing a configuration of a pattern writing apparatus also embodying the invention.

FIG. 9 is a conceptual diagram showing a configuration of a pattern writing apparatus in the embodiment 2.

In FIG. 9, the arrangement shown herein is similar to that of FIG. 1 with the detector 218 being replaced by a detector 214 which is built in the XY stage 105 and with the Si substrate 20 being replaced by a Si substrate 22. In FIG. 9, those constituent parts necessary to explain the embodiment 2, are illustrated. It is permissible that other arrangements are included in the EB lithographic apparatus 100 in the embodiment 2.

Firstly, a workpiece, e.g., Si substrate 22 having its surface on which a dot mark 10 is formed, is disposed on the XY stage 105. This XY stage 105 is pre-adjusted adjusted in position so that an electron beam 200 irradiates the Si substrate 20. This Si substrate 20 may be externally conveyed and loaded onto the XY stage 105 or, alternatively, may be fixedly placed in advance on the XY stage 105. In the case of prefixation on XY stage 105, it is preferable that the substrate be fixed and disposed at a position which does not disturb the layout of mask blanks or the like to be inherently applied pattern writing.

In the embodiment 2, a detection technique of the transmission type is used, so it is preferable that the thickness of Si of the Si substrate 22 which becomes a foundation or undercoat of the dot mark 10 is set at 1 μm or less. Additionally, the Si substrate 22 may be of the membrane type with a residual thin-film or, alternatively, the stencil type with a boundary portion relative to the dot mark 10 being penetrated.

Then, the electron beam 200 that was shaped to have a rectangular shape such as shown in FIG. 3 by way of example is driven and deflected to scan toward the dot mark 10, causing the detector 214 to detect the electron beam 200 that transmitted up to immediately before hitting of the electron beam 200 at the dot mark 10. A signal detected by the detector 214 is amplified by the amplifier 326, converted by ADC 328 into digital information, and then sent to the control computer 310. In the embodiment 2, the electron beam 200 cannot be detected by the detector 214 while it is hitting the dot mark 10 so that computation may be sequentially executed while letting the presence and absence of signal detection be inverse to that in the embodiment 1.

EMBODIMENT 3

Figure 10:
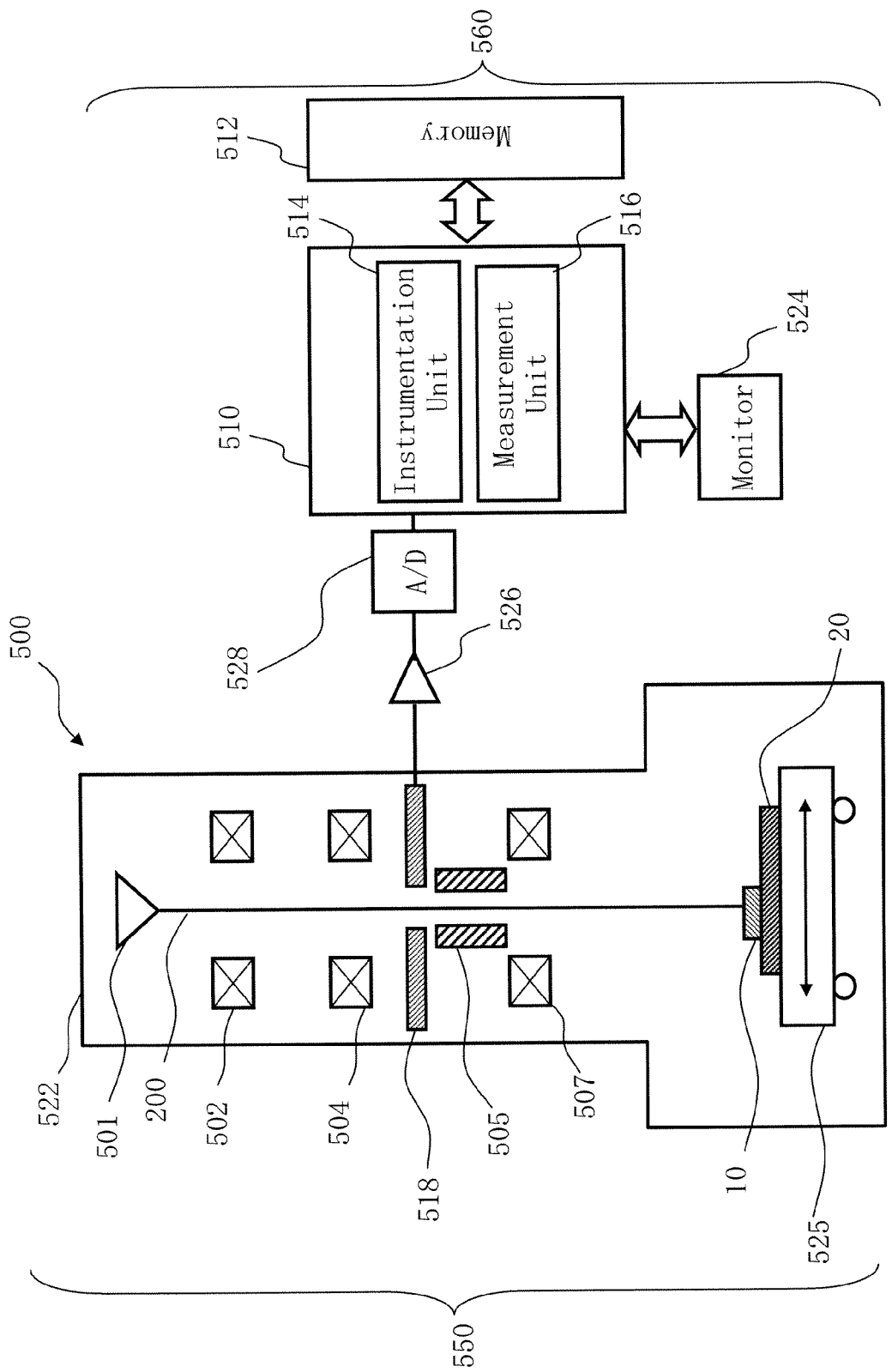
FIG. 10 is a conceptual diagram showing an arrangement of an electron microscope in accordance with a further embodiment of the invention.
Figure 11:
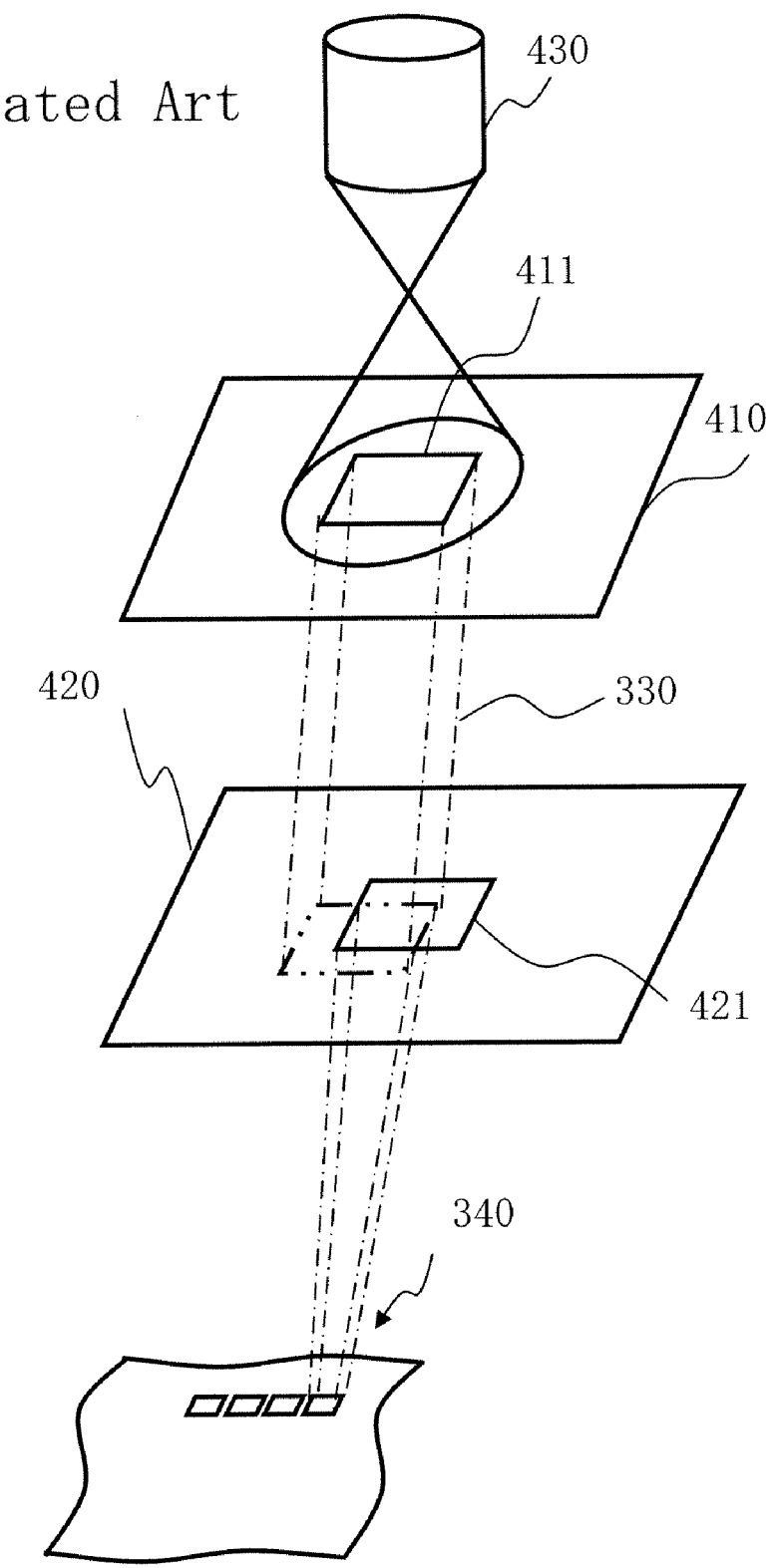
FIG. 11 is a conceptual diagram for explanation of an operation of one prior known variable-shaped electron beam pattern writing apparatus.
Figure 12:
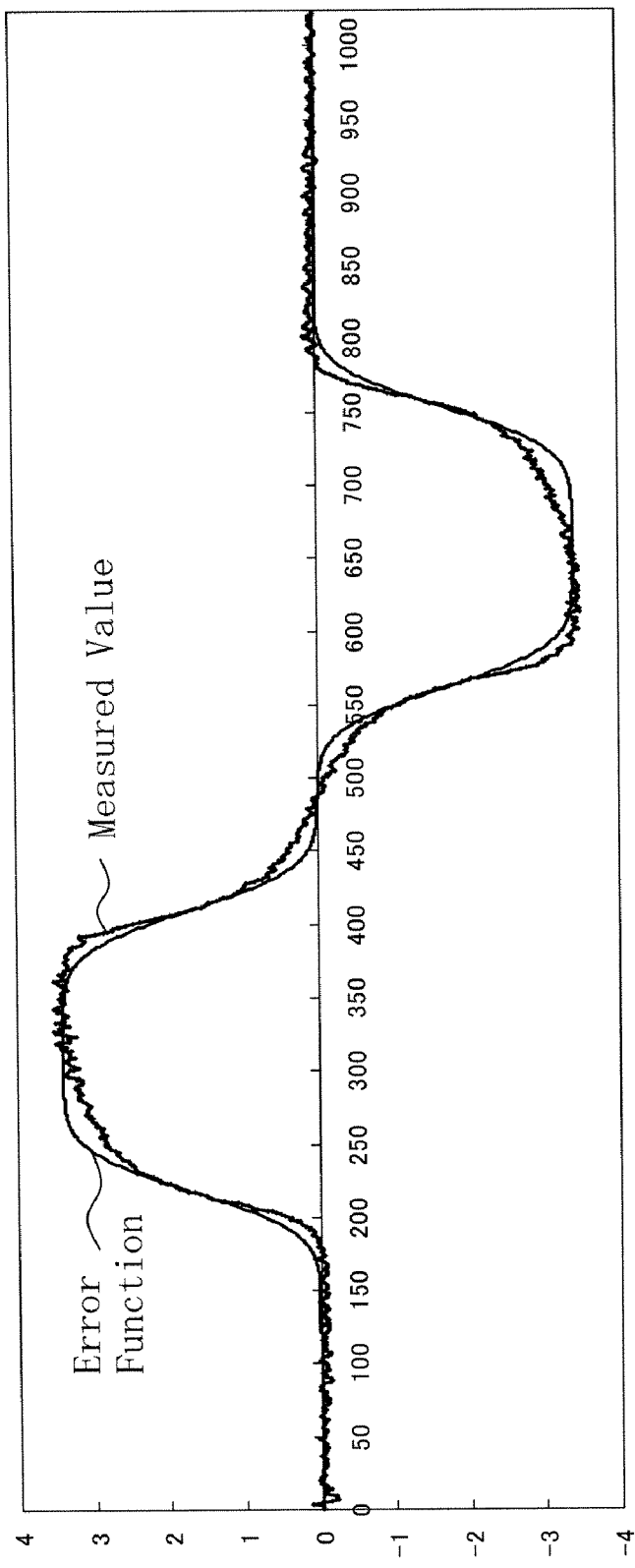
FIG. 12 is a diagram showing one example of a beam strength distribution.

FIG. 10 is a conceptual diagram showing an arrangement of an electron microscope in accordance with a further embodiment of the invention.

In FIG. 10, a scanning electron microscope (SEM) 500 becomes one example of the charged-particle beam apparatus. The SEM 500 comprises an electron lens barrel 522 making up an optical system 550, an XY stage 525, an electron gun 501 (irradiation unit), illumination lens 502, projection lens 504, deflector 505, objective lens 507, and detector 518. It also includes as a control unit 160 a control computer (CPU) 510, memory 512, amplifier 526, analog-to-digital converter (ADC) 528, and monitor 524.

The electron gun 501, illumination lens 502, projection lens 504, deflector 505, objective lens 507 and detector 518 are disposed within the electron lens barrel 522. A Si substrate 20 with the dot mark 10 laid out thereon is mounted on the XY stage 525 in a similar way to the embodiment 1. In FIG. 10, only those constituent components necessary to explain the embodiment 3, are shown. Other arrangements may be included in the SEM 500. Also note that although in FIG. 10 a specific configuration is shown for causing the CPU 310 that becomes one example of the computer to execute processing tasks of respective functional units, such as the instrumentation unit 514 and measurement unit 516, this is not an exclusive one, and implementation may be done in combination of electrical circuitry-based hardware and software in a similar way to the embodiment 1. Alternatively, it may be a combination of such hardware and firmware. Still alternatively, the CPU 310 may be configured from electrical circuit-based hardware in place of the CPU 310.

An electron beam 200 as emitted from the electron gun 501 is projected to downstream side by the illumination lens 502 and projection lens 504. Then, its position is controlled by the deflector 505. Focusing adjustment is done by the objective lens 507. Thus, the beam is irradiated in such a way as to scan on the dot mark 10 which becomes a metal mark on the Si substrate 20 on the movably disposed XY stage 525. Input/output data, such as a result of computation by the control computer 510, are stored in the memory 512.

Upon hitting of the electron beam 200 to the dot mark 10, reflection electrons fly out of the dot mark 10 due to irradiation of the electron beam 200. Then, such fly-out reflection electrons are detected by the detector 518. A signal detected by the detector 518 is amplified by the amplifier 526, converted by ADC 528 into digital information, and then sent forth toward the control computer 510. Then, such the signal is displayed as an image on the screen of the monitor 524. Here, as in the above-stated embodiments, the beam intensity I of the electron beam 200 is computed from a detection result of the ADC 528 whereby it is possible to obtain the intended beam resolution from the electron beam's intensity distribution and/or the beam intensity distribution.

As apparent from the foregoing, it is possible to similarly employ and incorporate this technique not only in lithographic apparatus such as the above-stated embodiments but also in electron microscope equipment such as this embodiment.

Several illustrative embodiments have been explained with reference to practical examples thereof. However, this invention should not be limited to these examples. For example, although in the above-stated embodiments the beam resolution is defined as the value σ which is a parameter of the error function, the beam resolution $(x_b-x_a)$ may also be represented by 1.8σ in case the beam resolution is defined by a width (length) of from a position $x_a$, that becomes 10% of the maximum beam intensity to a position $x_b$, that becomes 90%. Accordingly, when defining the beam resolution by those other than the error function parameter value σ, it is also possible to perform estimation by multiplication of the value σ and an appropriate coefficient.

In addition, the mark shape used for the mark shape function P(x) is not limited in any way to the above-stated shape and may be designed to have any one of other suitable ones, which is selected on a case-by-case basis. The one that is arranged to approximate the waveform obtained through measurement in the way stated above by a function with the mark shape function being convoluted is involved in this invention.

Also note that although explanations are omitted as to those parts which are not directly related to the description of this invention, such as apparatus arrangements and control techniques it is possible to use any required apparatus arrangements and control schemes through adequate selection on a case-by-case basis. For example, although a control unit arrangement for control of the EB lithographic tool 100 is not specifically recited in the description above, it is needless to say that any necessary control unit configuration is used through adequate selection.

Miscellaneously, beam intensity distribution measurement methods of all possible charged particle beams and beam resolution measurement methods of charged particle beams as will as charged-particle beam pattern writing methods and charged-particle beam apparatuses including charged-particle beam writing apparatus and scanning electron microscopes, which comprise the elements of this invention and which are modifiable and alterable in design by those skilled in the art whenever the need arises, are encompassed within the scope and coverage of the invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A charged particle beam apparatus comprising:
   an irradiation unit operative to irradiate a charged particle beam;
   an instrumentation unit operative to perform instrumentation of a reflection signal from a mark as obtained by scanning the mark while irradiating the charged particle beam onto said mark; and
   a measurement unit operative to use an approximation equation defined by use of a prespecified mark shape function and an error function to perform fitting of a waveform obtained based on said reflection signal and measure a beam resolution for use as a parameter of said error function from the waveform obtained based on said reflection signal.

2. The apparatus according to claim 1, wherein a mark shape with respective sides at anterior and posterior positions along a scanning direction of said charged particle beam being slanted to become wider downwardly is used as the shape of the mark defined in said prespecified mark shape function.

3. The apparatus according to claim 2, wherein a mark shape with a terminate end portion of a top pace being slanted toward its associated one of said sides is used as the shape of the mark defined by said prespecified mark shape function.

4. The apparatus according to claim 2, wherein a mark shape with its top face being curved is used as the shape of the mark defined by the prespecified mark shape function.

5. The apparatus according to claim 1, wherein said approximation equation used is an integration function of a product of said error function differentiated with said prespecified mark shape function.

6. The apparatus according to claim 1, wherein said apparatus includes a lithographic apparatus for writing a pattern on a workpiece.

7. The apparatus according to claim 1, wherein said apparatus includes a scanning electron microscope ("SEM").

8. A charged particle beam apparatus comprising:
   an irradiation unit operative to irradiate a charged particle beam;
   an instrumentation unit operative to perform instrumentation of a transmission signal of particles which exhibits penetration without hitting a mark, said signal being obtained by performing scanning by the charged particle beam from a near side of the mark until the beam passes through said mark; and
   a measurement unit for using an approximation equation defined by use of a prespecified mark shape function and an error function to perform fitting of a waveform obtained based on said transmission signal and for measuring a beam resolution for use as a parameter of said error function from the waveform obtained based on said transmission signal.

9. A method for measuring resolution of a charged particle beam, said method comprising:
   scanning on a mark while irradiating the mark with a charged particle beam;
   measuring a reflection signal from said mark due to irradiation of the charged particle beam; and
   using an approximation equation defined by use of a prespecified mark shape function and an error function to perform fitting of a waveform obtained based on said reflection signal and measure a beam resolution for use as a parameter of said error function from the waveform obtained based on said reflection signal.

10. The method according to claim 9, wherein a mark shape with respective sides at anterior and posterior positions along a scanning direction of said charged particle beam being slanted to become wider downwardly is used as the shape of the mark defined in said prespecified mark shape function.

11. The method according to claim 10, wherein a mark shape with a terminate end portion of a top face being slanted toward its associated one of said sides is used as the shape of the mark defined by said prespecified mark shape function.

12. The method according to claim 10, wherein a mark shape with its top face being curved is used as the shape of the mark defined by the prespecified mark shape function.

13. The method according to claim 9, wherein said approximation equation includes an integration function of a product of said error function differentiated with said prespecified mark shape function.

* * * * *